(12) United States Patent
Zielinski et al.

(10) Patent No.: US 6,252,446 B1
(45) Date of Patent: Jun. 26, 2001

(54) METHOD AND ELECTRICAL CIRCUIT FOR REGULATING DEAD TIME GIVEN VARYING PULSE REPETITION RATES

(75) Inventors: Michael Zielinski, Unterschielssheim; Gerhard Ziller, Dachau, both of (DE)

(73) Assignee: MTU Motoren-und Turbinen-Union München GmbH, Munich (DE)

( * ) Notice: Subject to any disclaimer, the term of this patent is extended or adjusted under 35 U.S.C. 154(b) by 0 days.

(21) Appl. No.: 09/367,908

(22) PCT Filed: Dec. 16, 1998

(86) PCT No.: PCT/DE98/03699

§ 371 Date: Nov. 15, 1999

§ 102(e) Date: Nov. 15, 1999

(87) PCT Pub. No.: WO99/33176

PCT Pub. Date: Jul. 1, 1999

(30) Foreign Application Priority Data

Dec. 19, 1997 (DE) .............................................. 197 56 664

(51) Int. Cl.[7] ...................................................... H03K 3/17
(52) U.S. Cl. .......................... 327/172; 327/173; 327/174; 327/175

(58) Field of Search .................................... 327/172, 173, 327/174, 175, 176

(56) References Cited

U.S. PATENT DOCUMENTS

| 3,866,128 | * | 2/1975 | Fletcher et al. | 327/172 |
| 4,652,833 | | 3/1987 | Batts | 327/354 |
| 4,772,793 | * | 9/1988 | Larson et al. | 327/31 |
| 5,027,298 | * | 6/1991 | Khazam | 327/261 |
| 5,045,800 | * | 9/1991 | Kung | 327/176 |

FOREIGN PATENT DOCUMENTS

| 224 733 A1 | 7/1985 | (DD) . |
| 28 47 290 C2 | 5/1980 | (DE) . |
| 32 40 853 C2 | 5/1983 | (DE) . |

* cited by examiner

Primary Examiner—Kenneth B. Wells
Assistant Examiner—Paul Dinh
(74) Attorney, Agent, or Firm—Schiff Hardin & Waite

(57) ABSTRACT

A method and an electrical circuit for converting highly structured analog signals arriving with variable pulse frequency into trigger pulses with an electronic circuit that locks the trigger pulses for a specific time, which is referred to as a dead time. The dead time being adapted to the current pulse frequency of the analog signals.

17 Claims, 1 Drawing Sheet

METHOD AND ELECTRICAL CIRCUIT FOR REGULATING DEAD TIME GIVEN VARYING PULSE REPETITION RATES

BACKGROUND OF THE INVENTION

The present invention is directed to a method for converting pulse-shaped, highly structured analog signals into trigger pulses with an electronic circuit whereby the trigger pulses are locked for a specific time, which is referred to as dead time, and is also directed to an electrical circuit operating in accordance with the method.

In various measurements, trigger pulses that are highly precise in terms of time, are required. Trigger pulses are derived from the signal rise of analog signals. For example, position signals of the blades of turbine engines, that are highly precise in terms of time, are required. Optical probes are utilized for this purpose. The blades pass through an illumination beam prepared by the probe, and analog signals are acquired from the light reflected from the end face of the blades. The irregular surface structure of the end faces of the blades can lead to fractured analog signals with which fades down to zero are possible.

For converting the analog signals into trigger pulses according to the prior art, the beginning of a trigger pulse is derived with a trigger circuit when the analog signal exceeds a specific threshold, the trigger pulse being in turn ended when the threshold is downwardly transgressed. Given highly fractured analog signals that comprise fades down to zero, misfirings occur given such a method since an individual analog signal is not converted into a long trigger pulse but into a number of shorter sub-pulses.

In order to prevent multiple triggerings, the trigger circuit given this known method, is locked for a specific time, which is referred to as dead time, after every triggering that ensues, whereby the dead time is manually set to a fixed value.

What thereby has a disadvantageous effect is that, in order to avoid pulse failures, the dead time must be selected shorter than the shortest time spacing of the analog signals to be anticipated. Therefore given decreasing signal frequencies and analog signals that become correspondingly longer, these are no longer completely covered by the dead time and multiple triggerings occur.

SUMMARY OF THE INVENTION

An object of the present invention is to provide a method for converting pulse-shaped, highly structured analog signals into trigger pulses with an electronic circuit that locks the trigger pulses for a dead time such that exactly one trigger pulse is formed for each analog signal under all operating conditions without further manual adjustment.

This object is inventively achieved in accordance with the present invention in a method that adapts the dead time to the current pulse frequency of the analog signals.

As a result of the inventive method, manual operations no longer need be performed on the measurement given the conversion of analog signals with varying pulse frequency, this making the conversion insensitive to great changes in pulse frequency within a measurement and suppressing multiple triggerings or pulse failures.

Advantageously, the analog signals are converted into raw pulses of a defined voltage as long as they exceed a threshold, these raw pulses being subsequently converted into trigger pulses having variable pulse width and fixed pulse height. The steep signal edge of the trigger pulses thereby forms a mark that is highly precise in terms of time. The pulse width that corresponds to the dead time is preferably defined by a setting signal that is generated by a comparison of the temporal average of the sequence of the trigger pulses to a reference signal.

In a preferred conversion of the trigger pulses into final pulses, final pulses are derived from the leading signal edges of the trigger pulses, so that signals having a defined height and a defined width arise. This can be advantageous for some applications.

The reference signal, which preferably serves for comparison to the temporal average of the sequence of trigger pulses for defining the setting signal, is preferably set in a range that is defined by the upper and lower voltage level of the trigger pulses and the relative pulse width of the analog signal. It has proven especially advantageous to select the reference signal from a range of control that is limited by the sum of the lower voltage level $U_1$ of the trigger pulses and twice the product of the quotient of pulse duration $T_P$ and cycle $T_A$ of the analog signal with the difference between the upper and lower voltage level $U_h$ and $U_1$ of the trigger pulses or by the sum of the lower voltage level $U_1$ of the trigger pulses and half the difference between upper voltage level $U_h$ and lower voltage level $U_1$ of the trigger pulses (the described range shall be referenced below by:

$$\left[ U_1 + 2\frac{T_P}{T_A}(U_h - U_1),\ U_1 + \frac{1}{2}(U_h - U_1) \right] ).$$

A trigger module that generates the raw pulse for the time wherein the analog signal exceeds a threshold is employed for converting the analog signals into raw pulses. In particular, a comparator is employed as trigger module.

The conversion of the raw pulses into trigger pulses is preferably implemented in a first controllable pulse generator. What is thereby particularly involved is a first mono-vibrator equipped with a control input. This control input allows the length of the trigger pulses to be controlled with the setting signal adjacent thereat and to simultaneously block the input of the mono-vibrator during the output of the trigger pulse.

The average of the sequence of trigger pulses required for the comparison to the reference signal is preferably formed by a low-pass filter. The comparison of the averaged trigger signals and of the reference signal preferably occurs in a regulator, particularly in a PID regulator, that, as a result, supplies the setting signal whose value corresponds to the pulse length. The regulator thereby varies the setting signal and, thus, the pulse length until the average of the trigger pulses corresponds to the reference signal.

The conversion of the trigger pulses with variable pulse length into final pulses with defined height and defined width is preferably implemented in a second pulse generator, particularly a second mono-vibrator.

Another object of the present invention is to provide an electrical circuit for converting highly structured analog signals arriving with variable pulse frequency into trigger pulses that are locked up for a specific time, which is referred to as a dead time.

This object is achieved in accordance with the invention in a an electrical circuit of the above-described type that is inventively characterized to adapt the dead time to the current pulse frequency.

The circuit preferably contains four active components, whereby a trigger module converts the analog signals into raw pulses with a defined voltage as long as they exceed a threshold. Advantageously, a first pulse generator, which has a control input, converts these raw pulses into trigger pulses having variable pulse width and fixed pulse height. The pulse width is thereby controlled via a setting signal at the control input. The input of the first pulse generator is blocked during the output of the trigger pulses. A third component preferably forms the temporal average of the sequence of trigger pulses, this being compared to a reference signal in a regulator. As a result of this comparison, the setting signal is connected to the control input of the first pulse generator and controls the width of the trigger pulses, this corresponding to the dead time. The regulator thus varies the setting signal and, thus, the pulse width, until the temporal average of the sequence of trigger pulses and the reference signal coincide. These trigger pulses exhibit a fixed pulse height and their steep signal rise serves as high-precision timing or mark and a beginning of an event.

The structuring of the electrical circuit can be realized with different components or with assemblies adapted to applications. In a preferred embodiment, the trigger module is a comparator that compares the analog signal to a threshold and outputs a raw pulse as long as the output signal exceeds the threshold. The first pulse generator is advantageously fashioned as a mono-vibrator with control input. The third component, which implements the temporal average formation over the sequence of trigger pulses, is preferably a matter of a low-pass filter. The regulator is preferably fashioned as PID regulator.

The invention is now described in greater detail below with reference to an embodiment shown in the drawing, further details, features and advantages deriving therefrom.

DETAILED DESCRIPTION OF THE PRESENTLY PREFERRED EMBODIMENTS

Figure 1:
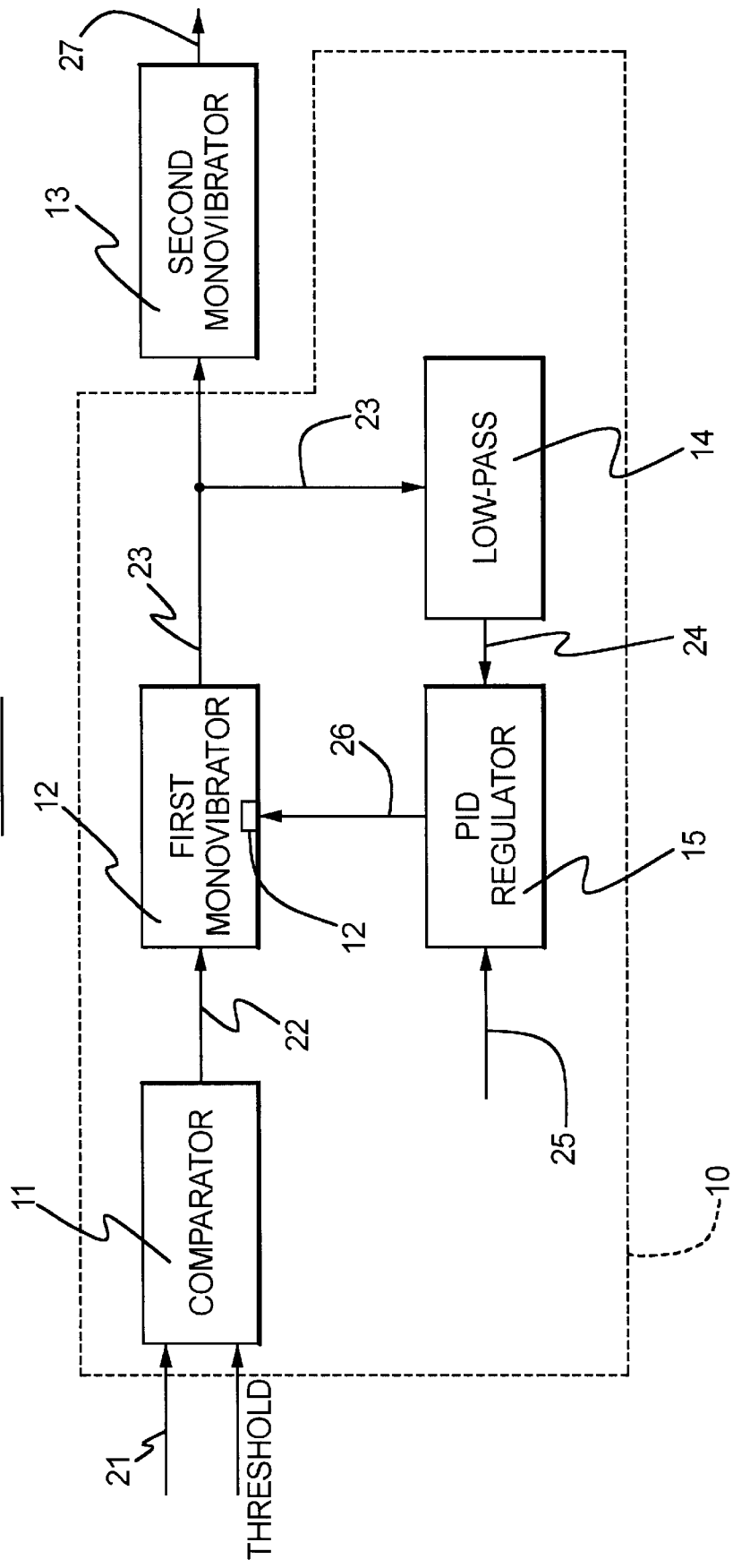
FIG. 1 is a block diagram of an embodiment of an electrical circuit for the conversion of highly structured analog signals arriving with variable pulse frequency into trigger pulses constructed and operated in accordance with the present invention(s).

The block diagram shown in FIG. 1 is an embodiment of an electrical circuit 10 for converting highly structured analog signals 21 arriving with variable pulse frequency into trigger pulses 23 and of a following, second mono-vibrator 13 for converting the trigger pulses 23 into final pulses 27 having a defined height and define width. The analog signals 21 first arrive at the comparator 11 which is incorporated as a trigger module. Raw pulses 22 with defined voltage are derived therein as long as the analog signal 21 exceeds a threshold. Given highly structured analog signals 21 with fades below the threshold, multiple triggerings are possible without further ado here because the raw pulses 22 are interrupted as soon as the analog signal 21 drops below the threshold, even when this occurs within a pulse of the structured analog signal 21.

The raw pulses 22 are forwarded onto an input of a first mono-vibrator 12 with control input 12' and employed as a first pulse generator, this responding to each raw pulse 22 with a trigger pulse 23 in its unblocked condition whose width is defined via the control input 12' of the mono-vibrator 12 by a setting signal 26 adjacent thereat. The input of the first mon-vibrator 12 is blocked during the output of the trigger pulses 23, so that the width of the trigger pulses 23 correspond to the dead time.

The setting signal 26 required for determining the pulse width is derived from the trigger pulses 23. To this end, a temporal average 24 of the sequence of trigger pulses 23, as presented in this exemplary embodiment, is formed by a low-pass filter 14 having a tuned limit frequency. This temporal average 24 is characteristically dependent on the pulse width and is also dependent on whether multiple triggerings due to fractured analog signals occur or not.

The regulation is implemented in a PID regulator 15. A rated/actual comparison is implemented here between the temporal average 24 and the reference signal 25 that is set to a value in the range $$\left[ U_1 + 2\frac{T_P}{T_A}(U_h - U_1), \ U_1 + \frac{1}{2}(U_h - U_1) \right],$$

and the setting signal 26 for the control input 12' of the first mono-vibrator 12 is derived. This occurs such that the PID regulator varies the setting signal 26 until the average 24 coincides with the reference signal 25.

For specific demands, it is desirable to obtain trigger pulses with a defined, fixed pulse width. To this end, a second mono-vibrator 13 follows in the illustrated exemplary embodiment, this deriving the final pulses 27 with defined height and defined width at the positive signal edges of the trigger pulses. The conversion, however, does not alter the fact that the trigger pulses themselves already represent high-precision marks in terms of time. It can simply be advantageous for some applications to be able to output trigger pulses having a defined, constant pulse width, i.e. final pulses.

Given, for example, a pulse frequency of the analog signals of 0.04 through 40 kHz and given a ratio of the pulse width to the cycle of the analog signals of 0.7 through 14.0%, the analog signals can be reliably covered with this method with a reference signal of $U_1+0.37 \ (U_h-U_1)$, whereby the ambiguity limit of the control is high enough in order to deliver error-free results given fluctuations that occur given rapid changes in pulse frequency.

Although modifications and changes may be suggested by those of ordinary skill in the art, it is the intention of the inventors to embody within the patent warranted hereon all changes and modifications as reasonably and properly come within the scope of their contribution to the art.

What is claimed is:

1. A method for converting highly structured analog signals arriving with variable pulse frequencies into trigger pulses, said method comprising the steps of:

receiving analog signals;

identifying a current pulse frequency of said analog signals;

generating a dead time adapted to said current pulse frequency;

locking said trigger pulses for a locking period equal to said dead time; and outputting said trigger pulses upon expiration of said locking period.

2. The method according to claim 1, further comprising the steps of:

is if said received analog signals exceed a threshold limit, converting said analog signals into raw pulses having a defined voltage;

converting said raw pulses into trigger pulses having a variable pulse width corresponding to said dead time and having a fixed pulse height;

setting said pulse width of said trigger pulses according to a setting signal;

forming a temporal average of said trigger pulses; and generating said setting signal by comparing said temporal average of said trigger pulses to a reference signal.

3. The method according to claim 2, further comprising the step of:

converting said trigger pulses into final pulses having a defined pulse height and a defined pulse width.

4. The method according to claim 2, further comprising the step of:

defining said reference signal in a range of control determined by an upper and a lower voltage level of said trigger pulses and by a relative pulse width of said analog signals.

5. The method according to claim 2, further comprising the step of:

defining said reference signal in a range of control having a left limit defined by a sum of a lower voltage level $U_1$ of said trigger pulses and twice a product of a quotient of pulse duration $T_P$ and cycle $T_A$ of said analog signals with a difference of an upper $U_h$ and a lower $U_1$ voltage level of said trigger pulses, and having a right limit defined by a sum of said lower voltage level $U_1$ of said trigger pulses and half said difference between said upper voltage level $U_h$ and said lower voltage level $U_1$ of said trigger pulses, this being abbreviated as:

$$\left[ U_1 + 2\frac{T_P}{T_A}(U_h - U_1),\ U_1 + \frac{1}{2}(U_h - U_1) \right].$$

6. The method according to claim 2, wherein said converting said analog signals into raw pulses being implemented in a comparator.

7. The method according to claim 2, wherein said converting said raw pulses into said trigger pulses being implemented in a first mono-vibrator having a control input.

8. The method according to claim 2, further comprising the step of:

controlling said pulse width of said trigger pulses by a value of said setting signal and by blocking said input of said first pulse generator during output of said trigger pulses from said first pulse generator.

9. The method according to claim 2, wherein said forming said temporal average of said trigger pulses being implemented in a low-pass filter.

10. The method according to claim 2, wherein said comparing said temporal average of said trigger pulses to said reference signal being implemented in a PID regulator.

11. The method according to claim 2, wherein said converting said trigger pulses to final pulses being implemented in a second mono-vibrator.

12. An electrical circuit for converting highly structured inputted analog signals having variable pulse frequencies into trigger pulses, said electrical circuit comprising: an electrical device for identifying a current pulse frequency of said inputted analog signals, for generating a dead time adapted to said current pulse frequency, for locking said trigger pulses for a period equal to said dead time before outputting said trigger pulses, and for outputting said trigger pulses.

13. The electrical circuit according to claim 12, wherein said electrical device further comprises:

a trigger module for converting said analog signals into raw pulses having a defined voltage upon said analog signals having a voltage exceeding a threshold voltage;

a first pulse generator following said trigger module for converting said raw pulses into trigger pulses having a variable pulse width corresponding to said dead time and having a fixed pulse height, said first pulse generator having a control input;

a third component for generating a temporal average of said trigger pulses;

a regulator for comparing said temporal average of said trigger pulses to a reference signal, and outputting a result of said comparison as a setting signal to said control input of said first pulse generator, and for controlling a pulse width of said trigger pulses by blocking a further input of analog signals.

14. The electrical circuit according to claim 13, wherein said trigger module is a comparator.

15. The electrical circuit according to claim 13, wherein said first pulse generator is a first mono-vibrator having a control input.

16. The electrical circuit according to claim 13, wherein said third component is a low-pass filter.

17. The electrical circuit according to claim 13, wherein said regulator is a PID regulator.

* * * * *